(12) United States Patent
Campenhout

(10) Patent No.: US 6,502,232 B1
(45) Date of Patent: Dec. 31, 2002

(54) ELECTRONIC CIRCUIT DESIGN ENVIRONMENTALLY CONSTRAINED TEST GENERATION SYSTEM

(75) Inventor: David Van Campenhout, San Jose, CA (US)

(73) Assignee: Verisity Design, Inc., Mountain View, CA (US)

( * ) Notice: Subject to any disclaimer, the term of this patent is extended or adjusted under 35 U.S.C. 154(b) by 0 days.

(21) Appl. No.: 09/884,777

(22) Filed: Jun. 18, 2001

(51) Int. Cl.$^7$ .............................................. G06F 17/50
(52) U.S. Cl. ............................................. 716/18; 716/5
(58) Field of Search ........................................ 716/5, 18

(56) References Cited

U.S. PATENT DOCUMENTS 6,269,467 B1 * 7/2001 Chang et al. ................... 716/18
6,324,678 B1 * 11/2001 Dangelo et al. ............... 716/18

OTHER PUBLICATIONS

K.D. Jones, an J.P. Privitera; The Automatic Generation of Functional Test Vectors for Rambus Designs; 33$^{rd}$ Design Automation Conference; 1996.

Jun Yuan, Kurt Shultz, Hillel Miler, Adnan Aziz; Modeling Design Constraints and Biasing in Simulation Using BDDs; 1999 IEEE.

* cited by examiner

Primary Examiner—Don Wong
Assistant Examiner—Wilson Lee
(74) Attorney, Agent, or Firm—Michael A. Glenn; Kirk D. WOng

(57) ABSTRACT

An electronic circuit design environmentally constrained test generation system provides a corrector mechanism that filters the input signals to the design under verification (DUV) and ensures that inputs signals to the DUV are within the given environmental constraints that describe the limitations on the permissible inputs to the DUV. Both combinational and temporal constraints can be handled by the corrector, which consists of a new element, a mapper, and an observer. The mapper looks at the observer's state and external test sequence input value and changes non-compliant test sequence input to the DUV to place the DUV in a legal state if the input would place it on a track to an illegal state, thereby constraining the inputs to the normal expected operating environment of the DUV. An illegal state is a state from which the violation of at least one constraint is unavoidable. A feedback loop from the DUV to the observer may be implemented using constraints that rely upon the DUV's state.

16 Claims, 21 Drawing Sheets

| PS | PI = top.a top.b | | | |
|---|---|---|---|---|
| | 00 | 01 | 10 | 11 |
| 000 | 000/1 | 000/1 | 101/1 | 101/1 |
| 001 | 000/1 | 000/1 | 001/1 | 001/1 |
| 010 | 000/0 | 000/1 | 101/0 | 101/1 |
| 011 | 000/0 | 000/1 | 001/0 | 001/1 |
| 100 | 010/1 | 000/1 | 111/1 | 101/1 |
| 101 | 010/1 | 000/1 | 011/1 | 001/1 |
| 110 | 010/0 | 000/1 | 111/0 | 101/1 |
| 111 | 010/0 | 000/1 | 011/0 | 001/1 |

| PS_PI | top.a top.b | | | |
|---|---|---|---|---|
| | 00 | 01 | 10 | 11 |
| 010_00 | 0 | _ | 0 | 0 |
| 010_10 | 0 | 0 | 0 | _ |
| 011_00 | 0 | _ | 0 | 0 |
| 011_10 | 0 | 0 | 0 | _ |
| 100_00 | _ | _ | 0 | 0 |
| 100_01 | _ | _ | 0 | 0 |
| 100_10 | 0 | 0 | _ | _ |
| 100_11 | 0 | 0 | _ | _ |
| 11x_00 | _ | _ | 0 | 0 |
| 11x_01 | _ | _ | 0 | 0 |
| 11x_10 | 0 | 0 | _ | _ |
| 11x_11 | 0 | 0 | _ | _ |

| PS_PI | top.a top.b | | | |
|---|---|---|---|---|
| | 00 | 01 | 10 | 11 |
| 010_00 | 0 | 1 | 0 | 0 |
| 010_10 | 0 | 0 | 0 | 1 |
| 011_00 | 0 | 1 | 0 | 0 |
| 011_10 | 0 | 0 | 0 | 1 |
| 100_00 | 1 | 0 | 0 | 0 |
| 100_01 | 0 | 1 | 0 | 0 |
| 100_10 | 0 | 0 | 1 | 0 |
| 100_11 | 0 | 0 | 0 | 1 |
| 11x_00 | 0 | 1 | 0 | 0 |
| 11x_01 | 0 | 1 | 0 | 0 |
| 11x_10 | 0 | 0 | 0 | 1 |
| 11x_11 | 0 | 0 | 0 | 1 |

Fig. 19

ELECTRONIC CIRCUIT DESIGN ENVIRONMENTALLY CONSTRAINED TEST GENERATION SYSTEM

BACKGROUND OF THE INVENTION

1. Technical Field

The invention relates to electronic circuit design verification and validation in a computer environment. More particularly, the invention relates to constraining test simulator input signals to a design under verification to the ranges encountered in the design's normal operating environment.

2. Description of the Prior Art

Functional verification is concerned with ensuring that an electronic circuit design implements the intended functional behavior. Functional verification is commonly performed by applying deterministic or pseudo-random tests to a simulation model of the circuit design and analyzing its behavior.

A test generation engine takes a design and a set of test goals as input and produces tests, which are sequences of input vectors, that fulfill the test goals. A typical goal is to exercise all state transitions of a finite-state machine embedded in the circuit design.

Unconstrained test generation methods assume that the primary inputs to the circuit design under verification (DUV) can be driven independently of each other. The problem with these methods is that they may produce tests that are not meaningful because they fall outside the intended operating conditions for which the DUV was designed. A large numbers of tests are generated and a pass/fail outcome is computed for each test by simulating the design for each test. The user may have to sort through each failure, through manual or automatic means, to determine if the conditions leading to the failure are possible in the intended environment.

The circuit design, in its normal operating environment, is only going to be exercised for a certain set of legal behaviors. The legal behaviors are not defined by the circuit design itself, but rather the environment. In existing approaches, the circuit design parameters are used by the test generator and the environmental constraints are not taken into account. The test generator will then create tests that span the universe of behaviors. The challenge is to integrate the environmental constraints into test generation.

It would be advantageous to provide an electronic circuit design environmentally constrained test generation system that automatically constrains the test inputs to a DUV to the environmental constraints of the DUV's intended operating environment. It would further be advantageous to provide an electronic circuit design environmentally constrained test generation system that produces test results that are meaningful within the realistic operating parameters of the DUV.

SUMMARY OF THE INVENTION

The invention provides an electronic circuit design environmentally constrained test generation system. The system automatically constrains the test inputs to a design under verification (DUV) to the environmental constraints of the DUV's intended operating environment. In addition, the invention provides test results that are meaningful within the realistic operating parameters of the DUV.

A preferred embodiment of the invention provides a corrector mechanism that filters the input signals to the DUV. The corrector ensures that inputs signals to the DUV are within the given environmental constraints. Both combinational and temporal constraints can be handled by the corrector.

The corrector consists of a new element, a mapper, and an observer. The mapper looks at the observer's state and input value and changes the input to the DUV to place the DUV in a legal state if the input would place it on a track to an illegal state. The inputs are constrained to the normal expected operating environment of the DUV. The mapper is created by a compiler that takes into account the device's intended environment and the device's states.

The compiler creates the mapper by taking a description of the environmental constraints, and optionally a description of the DUV, and creates an abstract description of a finite state machine. A state graph is computed from the finite state machine. From the state graph, a set of states is analyzed where the states are found from which an illegal state is unavoidable. The mapper is created using these states. The set of inputs are fed to the DUV by the mapper. A feedback loop from the DUV to the observer may be implemented if the constraints rely upon the DUV's state.

Other aspects and advantages of the invention will become apparent from the following detailed description in combination with the accompanying drawings, illustrating, by way of example, the principles of the invention.

BRIEF DESCRIPTION OF THE DRAWINGS

FIG. 15 is a next state and output function truth table according to the invention;

FIG. 17 is an updated mapper selection matrix according to the invention;

FIG. 19 is a final mapper selection matrix according to the invention;

DETAILED DESCRIPTION OF THE INVENTION

The invention is embodied in an electronic circuit design environmentally constrained test generation system in a computer environment. A system according to the invention automatically constrains the test inputs to a design under verification (DUV) to the environmental constraints of the DUV's intended operating environment. In addition, the invention provides test results that are meaningful within the realistic operating parameters of the DUV.

Temporal constraints are relationships between input and output signals over time and are commonly used to describe the operating conditions of a circuit design. Temporal constraints originate from the environment of the design, which may be the logic that surrounds the design if the design under verification (DUV) is a subsystem of a larger design. A large class of temporal constraints can be described by finite-state machines.

In addition to describing the operating conditions of a design, temporal constraints can also be used to restrict the operating conditions further to a region of interest to the verification engineer.

The DUV, in its normal operating environment, is only going to be exercised for a certain set of legal behaviors. The legal behaviors are not defined by the design itself, but rather the environment. Generally, the design parameters are used b y the test generator and the environmental constraints are not taken into account. The test generator will then create tests that span the universe of behaviors. The challenge is to integrate these environmental constraints into test generation. The invention provides a corrector mechanism that filters the input signals to the DUV. The corrector ensures that inputs signals to the DUV are within the expected environmental constraints. Both combinational and temporal constraint parameters in the general and specific design test cases are handled by the corrector.

Figure 1:
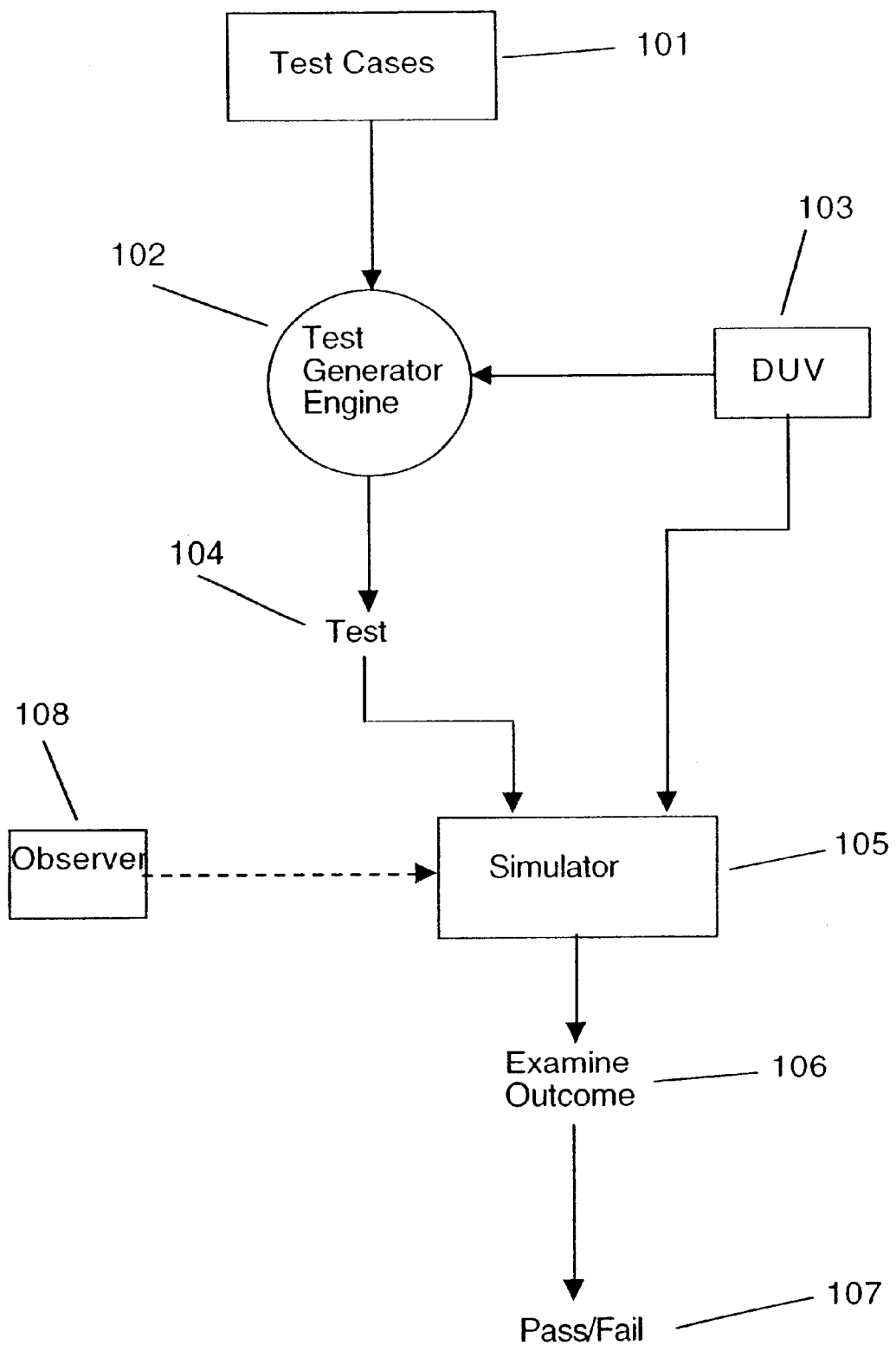
FIG. 1 is a block schematic diagram showing the prior art test generation and simulation process according to the invention.

Referring to FIG. 1, the prior art uses a test generator 102 and a set of test goals, or cases, 101 that may exercise every state transition of every finite state machine in the DUV 103. The test generator 102 creates a set of test inputs 104 from the test cases 101 and the DUV description 103. The test inputs 104 are ed into the simulator 105 as well as the DUV 103. The outcome of the simulator 105 is then examined 106 and a set of pass or fails 107 are determined.

The problem with this approach is that a large number of pass and fail conditions are created. The user must determine if the conditions leading to any given failure are possible in the intended environment. It is also well known in the art to add an observer 108, that is an abstraction of the environment. The observer is a finite-state machine that watches the test inputs and signals when tests violate the environmental constraints, in which case those tests have to be discarded.

Figure 2:
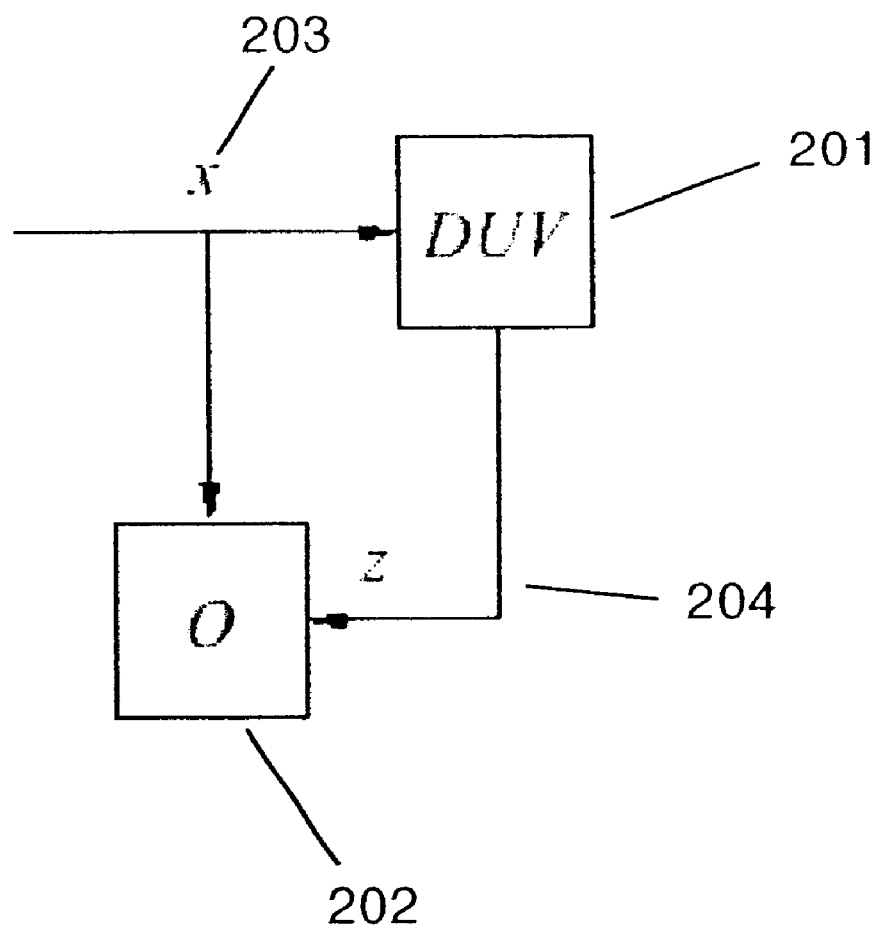
FIG. 2 is a block schematic diagram showing the prior art observer interfacing with a design under verification (DUV) according to the invention.

With respect to FIG. 2, the test sequence 203 is applied to the DUV 201 and at the same time to the observer 202. The state of the DUV 201 is observed at 204 and the observer 202 tells whether the test sequence, up to that point, has been legal or illegal. The observer 202 is expressed as a set of deterministic finite-state automata defining a set of constraints over the primary inputs x 203 and internal signals z 204 of the DUV.

Figure 3:
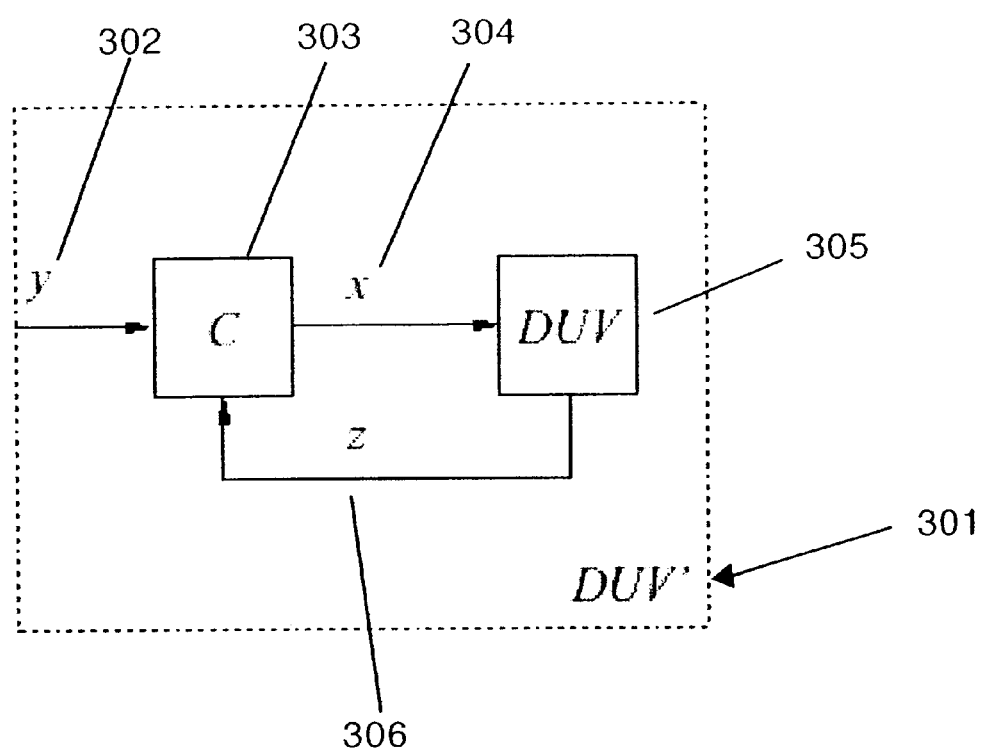
FIG. 3 is a block schematic diagram of a preferred embodiment of the invention showing a corrector mapping the input signals to a DUV according to the invention.

Referring to FIG. 3, a preferred embodiment of the invention provides a new system called DUV' 301 that is composed of the original DUV 305 and a corrector 303. The corrector 303 is fed the test sequence 302 and in turn, feeds the DUV 305 only test sequences 304 that are always legal for the specific environment. The corrector 303 looks at the external input sequences 301 and appropriately diverts them. The feedback loop 306 is required for constraints that depend on internal signals of the DUV 305.

The corrector transforms arbitrary sequences (y, z) into sequences (x, z) that adhere to all constraints. The corrector minimally restricts the set of sequences (y, z).

Figure 4:
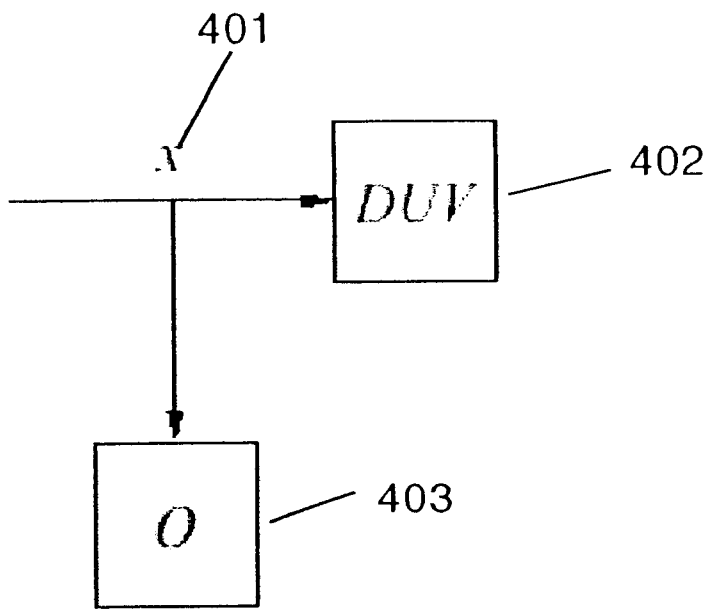
FIG. 4 is a block schematic diagram showing the prior art observer monitoring primary inputs only of a DUV according to the invention.
Figure 5:
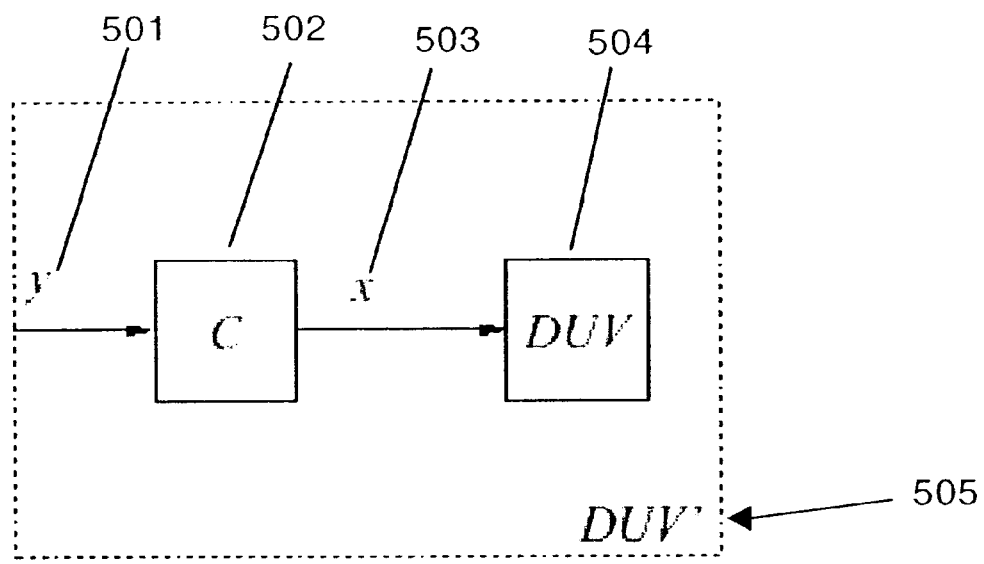
FIG. 5 is a block schematic diagram of a preferred embodiment of the invention showing a corrector mapping primary inputs to a DUV in case constraints are concerned with primary inputs only according to the invention.

With respect to FIGS. 4 and 5, a common case is where constraints concern only primary inputs 401 of the DUV 402. The problem simplifies to the situation shown as DUV' 505: the corrector 502 transforms arbitrary inputs 501 into mapped inputs 503 that adheres to all constraints.

The principle of operation of the corrector is as follows. Suppose that a sequence of input vectors has been applied to the DUV, and that, so far, none of the constraints watched by the observer have been violated. If the next input vector does not cause any constraint violation and it is not too late to avoid a constraint violation in the future, then the corrector feeds that input vector unaltered into the DUV. If that next input vector causes an immediate constraint violation, the corrector modifies the input vector and applies the modified input vector to the DUV. Also, f the next input vector would result in an unavoidable constraint violation in the future, the corrector applies a modified input vector to the DUV, thereby diverting the test sequence to stay within the legal space.

Figure 6:
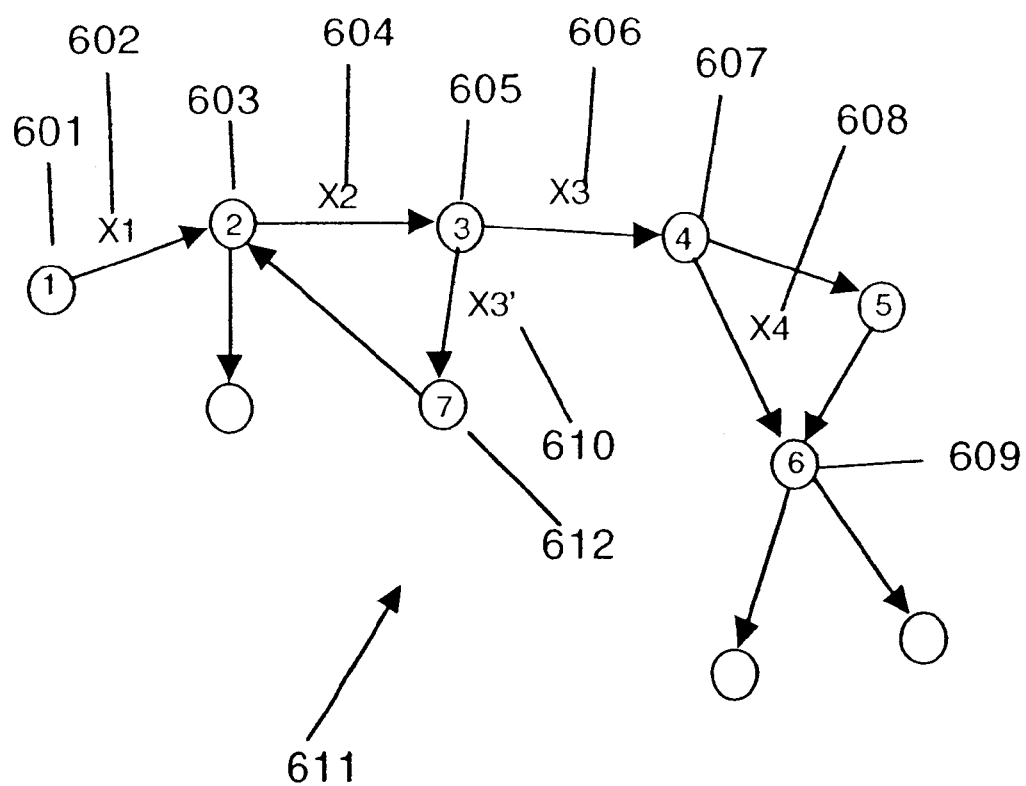
FIG. 6 is a block schematic diagram of a state transition diagram showing nodes where the path to an illegal state is unavoidable according to the invention.

With respect to FIG. 6, to illustrate the principle, consider the state transition graph of an observer shown. The initial state is state 1 601; state 6 violates the constraints corresponding to the observer. The task of the corrector is to fix input signals on the fly so that the observer never reaches a bad state. Suppose that input x1 602 is applied from the initial state 601; the observer transitions to state 2 603. Next, input x2 is applied and the observer transitions to state 3 605. Suppose that the next input vector is x3 606. At this point the corrector adjusts that input vector to x3' 610, because from state 4 607 it is not possible to avoid bad state 6 609. So in state 3 605, the corrector maps input x3 onto input x3'. Consequently, the observer transitions to state 7 612 and avoid state 4 607.

Figure 7:
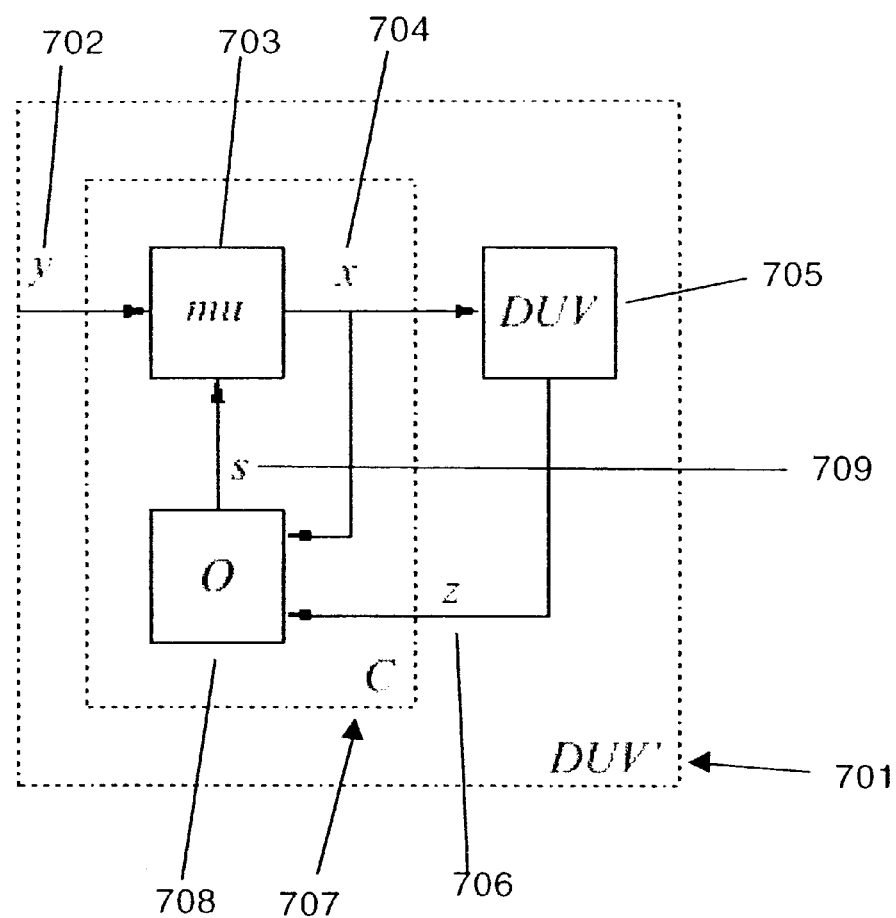
FIG. 7 is a block schematic diagram of a preferred embodiment of the invention showing the mapper and observer elements of a corrector according to the invention.

Referring to FIG. 7, a logic circuit that implements the corrector 707 can be built from a logic circuit of the observer 708, which is already available, and a new logic circuit, the mapper 703. The mapper 703 looks at the observer's 708 state and changes the external input 702 into an input signal 704 so that the sequence of input signals 704 that are applied to the DUV 705 always adhere to the constraints.

For constraints that involve both input and internal signals of the DUV, a conservative analysis results in a pessimistic corrector. The corrector may overly divert input sequences to ensure that there are no chances of reaching a bad state, even though some of these bad states are actually never reachable due to the DUV. A more complex analysis can take into account some of the specifics of the DUV to reduce the amount of conservatism. If the environment is such that the constraints only concern the input set and do not concern the state of the device, then the conservative analysis is exact: the assumptions are accurate and do not introduce conservatism.

Figure 8:
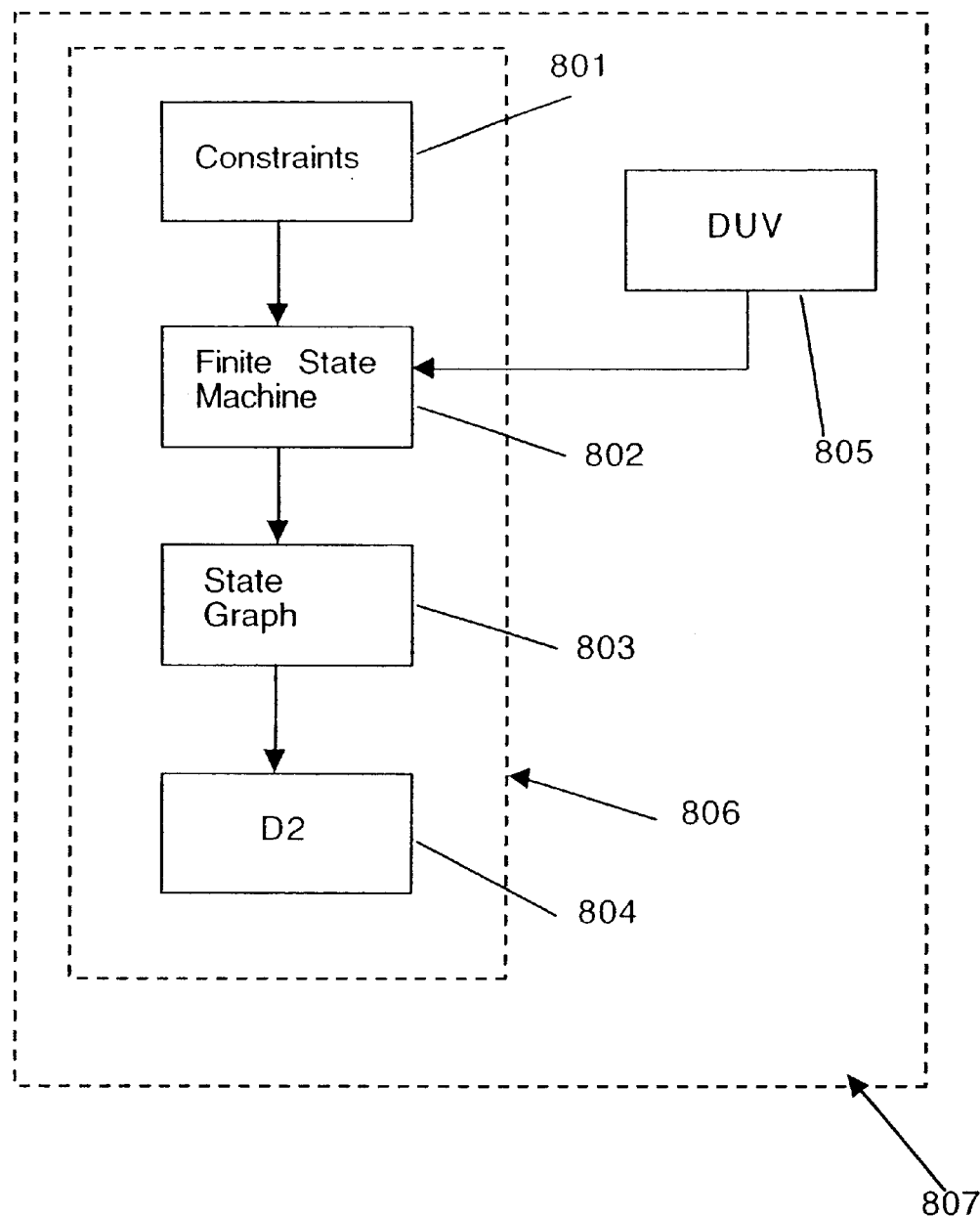
FIG. 8 is a block schematic diagram of a preferred embodiment of the invention depicting the steps that a compiler uses to create a mapper according to the invention.

Referring to FIG. 8, the compiler works under conservative analysis 806. From the description of the environmental constraints 801 it creates a finite-state machine representation 802 of the observer. It then computes and analyzes the state transition graph 803 of the observer. It computes the set of states D2 804, which are states from which an illegal state is unavoidable. It then uses the set D2 to synthesize the mapper 804. The mapper is combined with the observer to form the corrector as explained in FIG. 7.

The compiler can also perform a more aggressive analysis 807. The main difference with the conservative analysis is that during the construction of the finite-state machine representation 802 both the environmental constraints and a subset of that part of the DUV 805 that affects the constraints are taken into account. The compiler trades off accuracy versus computational cost of the analysis to determine the appropriate subset of the DUV to be considered. The remaining steps are as under the conservative analysis.

For constraints that involve input signals to the DUV only the conservative analysis and the more aggressive analysis give identical results.

Synthesis of a concrete corrector starts with an analysis of the observer that sets up a logic synthesis problem with generalized don't cares. The invention provides a solution to this problem called the mapper circuit. A corrector is then constructed from the observer and the mapper.

Referring again to FIG. 7, as indicated above, a corrector 707 is constructed by augmenting the observer 708. The corrector 707 is composed of the observer 708 and mapper 703. The mapper 703 is a combinational circuit that reads the unconstrained external input vector y 702, as well as the complete state s 709 of the observer 708 and produces a mapped vector x 704 that is applied to the DUV 705. Sequences $(z^i, x^i)$, where i=0, ..., n, satisfy the constraints specified by the observer 708.

Figure 9:
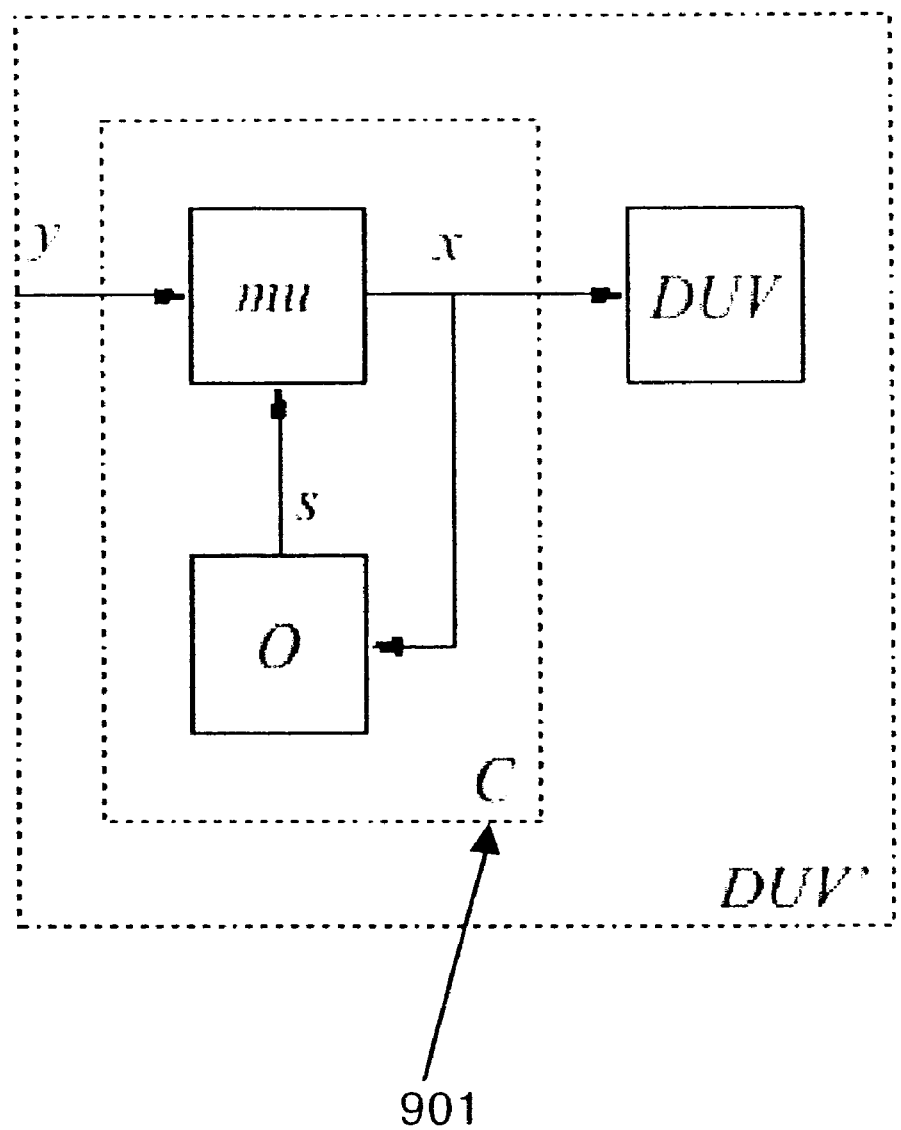
FIG. 9 is a block schematic diagram of a mapper and observer monitoring only primary inputs to a DUV according to the invention.

With respect to FIG. 9, the architecture of the corrector 901 simplifies for the case where the constraints involve primary inputs only. The feedback loop 706 is not required.

The environmental constraints are given as an observer O that is a deterministic finite-state automaton $O(Q, q_0, X, \delta, \lambda)$, where Q is the set of states $q_0$ is the initial state X: is the input space $\delta$: transition function $$\delta: Q \times X \to Q: s^{i+1} = \delta(s^i, x^{i+1})$$

$\lambda$: output function $\lambda: Q \times X \to \{0, 1\}$: $\lambda(s^{i+1}, x^{i+1}) =$
  1 if $(s^{i+1}, x^{i+1})$ does not violate the constraint
  0 if $(s^{i+1}, x^{i+1})$ violates the constraint Once the observer has detected a violation of the constraints, it will keep $\lambda=0$, i.e., $\lambda(s, x)=0 \to \lambda(s', x')$ for all states' reachable from $\delta(s, x)$ and for all x'.

Superscripts refer to sampling points.

As a preprocessing step for constructing a corrector, the following is derived from the observer:

R: set of states reachable from $q_0$.

$D_0$: set of reachable states that have only illegal outgoing transitions:

$$D_0 = \{s \in R | \forall x \in X: \lambda(s, x) = 0\}$$

$D_1$: set of reachable states from which an illegal outgoing transition is unavoidable. $D_1$ is the result of the following fix point computation:

$$D_1^0 = D_0$$

$$D_1^{i+1} = D_1^i \cup \{s \in R | \forall x \in X: \lambda(s, x) = 0 \hat{} \delta(s, x) \in D_1^i\}$$

$D_2$: set of reachable states that can reach a state in $D_1$ in one step, but are not in $D_1$.

$$D_2 = \{s \in R \setminus D_1 | \exists x \in X: \delta(s, x) \in D_1\}$$

$U_{ill1}$: illegal extended states:

$$U_{ill1} = \{(s, x) \in (R \setminus D_1) \times X | \lambda(s, x) = 0\}$$

$U_{ill2}$: additional illegal extended states:

$$U_{ill2} = \{(s, x) \in D_2 \times X | \delta(s, x) \in D_1\}$$

$U_{ill}$: all illegal extended states:

$$U_{ill} = U_{ill1} \cup U_{ill2}$$

Mapper Synthesis: Formulation

For a given observer $Q(Q, q_0, X, \delta, \lambda)$, we can construct a corrector C.

Y: external input space $\mu$: mapper: $\mu$: $S \times Y \to X$: $x^{i+1} = \mu(s^i, y^{i+1})$,
  where
  $\mu(s^i, y^{i+1}) =$
    $y^{i+1}$ if $(s^i, y^{i+1}) \in (R \times X) \setminus U_{ill}$
    a if $(s^i, y^{i+1}) \in U_{ill}$, where $a \in \{x \in X | (s^i, x) \notin U_{ill}\}$
    don't care otherwise Mapper Synthesis: Method In this section a heuristic procedure is presented for synthesizing a concrete mapper $\mu$. A matrix representation is given in the next section. In the following sections, three techniques are presented to synthesize a single component of $\mu$. The overall method is explained later.

Formulation

From the analysis above, given a state space Q, an input space X, a set of illegal extended states $U_{ill} \subset Q \times X$, and a set of don't care states $S_{dc} \subset Q$. The mapper synthesis problem (MSP) is that of constructing a combinational function $\mu$: $S \times X \to X$: $x = \mu(s, y)$ that satisfies:

$\mu(s, y) =$
  don't care if $s \in S_{dc}$
  a if $(s, y) \in U_{ill}$, where $a \in \{x \in X | (s, x) \notin U_{ill}\}$
  y otherwise Furthermore, $\mu$ should minimize a cost function.

Existence

MSP has a solution iff:

$$\forall (s, y) \in U_{ill}, \exists x \in X \text{ such that } (x \neq y) \hat{} (s, x) \notin U_{ill}$$

Selection Matrix

MSP can be represented in matrix form as follows. A mapper selection matrix (MSM) is defined which has a row for every extended state $(s, y) \in S \times X$ and a column for each $x \in X$. An entry in the row (s, y) and column x contains a '0' if $x = \mu(s, y)$ is not allowed according to cases 2, 3 in the above $\mu(s, y)$ equation; it contains a '1' if $x = \mu(s, y)$ is the only allowed choice for (s, y) (case 3); it contains a '–' if $\mu$(s, y) is one of many allowed choices (cases 1, 2).

For convenience, rows are omitted for which is no freedom. Every entry in such a row, except one, would contain a '0'; the remaining entry would contain a '1'. Hence, for such rows there is no choice regarding $\mu$(s, y).

All relevant information about MSP can be represented by the set $S_{dc}$ and the relation $\rho \subset S \times X \times X$, where:

$(s, y, x) \in \rho$ iff $((s, y) \in U_{ill}\hat{\ }(s, x) \notin U_{ill}) v (s \in S_{dc}) v$ $((x=y)\hat{\ }(s, y) \in (S \times X) \setminus U_{ill})$ So, $\rho$ contains all triples (s, y, x) for which the corresponding entries in MSM contain either '1' or '–'. The relation corresponding to each valid mapping is contained in $\rho$.

Identity Component Mapping

The ith component of $\mu$ is an identity mapping iff $\mu$(s, y)=$y_i$. This property is desirable because, in this case, the mapped signal $x_i$ is independent of the state of the corrector, and the original signal passes unaltered. A necessary and sufficient condition for the existence of a $\mu$ for which component $\mu_i$ is an identity mapping is:

$\forall (s, y) \in U_{ill}, \exists x \in X$ such that $(s, y, x) \in \rho\hat{\ }(x_i=y_i)$ The condition states that for each illegal extended state (s, y), there should be at least one valid mapping x for which the ith component $x_i=y_i$. If this condition holds, $\mu_i$ is given by:

$\mu_i = y_i$

For the remaining problem $\rho$ is updated as follows:

$\rho' \subset S \times X \times X'$: $(s, y, x') \in \rho'$ &iff $\exists x\_i \in \{0, 1\}$: $(s, y, <x', x_i>) \in \rho\hat{\ }(x_i = \mu_i(s, y))$ Where X' is X projected with respect to component $x_i$, and $<x', x_i>$ augments x' with component $x_i$. The MSM of the remaining problem is obtained as follows. Consider a row corresponding to (s, y). Half of the columns corresponds to x where $x_i \neq y_i$. For every entry in those columns, replace '–' by '0'. Note that these entries will never contain a '1'.

Component Mapping Independent of Observer State

In the presence of non-temporal (also called static or combinational) constraints, it makes sense to investigate if there exists a valid $\mu$ for which at least one component $\mu_i$ is independent of the state of the observer. A necessary and sufficient condition for the existence of such a $\mu$ is:

$\forall y \in X \, \forall v \in \{0, 1\}: \forall s \in S, \exists x \in X: (s, y, x) \in \rho\hat{\ }(x_i=v)$ If the condition holds, $\mu_i$ is given by the following interval:

$\mu_i^U = \exists x_i: x_i\hat{\ }\sigma(y, x_i)$ $\mu_i^L = \exists x_i: \overline{x_i}\hat{\ }\sigma(y, x_i)$ $\mu_i^L \leq \mu_i \leq \mu_i^U$ , where $\sigma \subset S \times \{0, 1\}$: $(y, v) \in \sigma$ iff $\forall s \in S, \exists x \in X: (s, y, x) \in \rho\hat{\ }(x_i=v)$ For the remaining problem, $\rho$ is updated as before (see Identity component mapping, above).

Note that an identity mapping is a special case of a state-independent mapping.

Single Component: General Case

If none of the special cases discussed above applies, we can synthesize a single component $\mu_i$ as follows.

$\mu_i^U(s, y) = \exists x \in X: x_i\hat{\ }\rho(s, y, x)$ $\mu_i^L(s, y) = \exists x \in X: \overline{x_i}\hat{\ }\rho(s, y, x)$ $\mu_i^L \leq \mu_i \leq \mu_i^U$ For the remaining problem, $\rho$ is updated as before (see Identity component mapping, above).

Overall Method

The heuristic method to solve MSP has three phases. During the first phase, consider each component i, and check if we can synthesize an identity mapping for that component (see Identity component mapping, above). If so, then set $\mu_i=y_i$, and continue with the next component. During the second phase, consider each remaining component, and check if we can synthesize a $\mu_i$ that is independent of the state of the observer (see Component mapping independent of observer state, above). If so, then synthesize component i, and continue with the next component. During the last phase, synthesize each remaining component, one at a time (see Single component: general case, above).

Algorithm csynth

---

1.    for each component i {
      if ( an identity mapping exists for component i ) {
         synthesize identity mapping for component i
      }
   }
2.    for each component i not yet synthesized {
      if ( a state-independent mapping exists for component i) {
         synthesize a state-independent mapping for component i
      }
   }
3.    for each component i not yet synthesized {
      synthesize component i
   }

---

Extensions for Constraints on Internal Signals of the DUV

So far it has been assumed that constraints are only concerned with primary input signals of the DUV. In this section, the more general case is addressed where constraints involve both primary inputs and internal signals of the DUV. Let Z be the space of internal signals that appear in the constraints. FIGS. 2, 3, and 7 reflect the presence of the internal signals to the invention's architecture. The definitions of the observer (see above) are affected as follows:

An observer $O(Q, q_0, X, \delta, \lambda,)$ for each constraint:

Q; state space $q_0$: the initial state

X: input space

Z: space of internal signals appearing in constraints $\delta$: transition function $\delta: S \times X \times Z \rightarrow S: s^{i+1} = \delta(s^i, x^{i+1}, z^{i+1})$ $\lambda$: output function $\lambda: S \times X \times Z \rightarrow \{0, 1\}: \lambda(s^i, x^{i+1}, z^{i+1}) =$
1 if $(s^i, x^{i+1}, z^{i+1})$ is legal
0 if $(s^i, x^{i+1}, z^{i+1})$ is illegal In the following two analyses are presented: an aggressive and a more conservative.

Aggressive Analysis

The aggressive analysis takes into account the correlation among the internal signals z that affect the constraints. To this end it considers an abstract model for that part of the DUV that affects the constraints. The choice of abstract model involves a tradeoff between accuracy and computational cost of the analysis. The abstract model is a finite-state machine $A(Q^a, q_0^a, X \times U, \delta^a, \lambda^a)$:

$Q^a$: the state space $q_0^a$: the initial state $X \times U$: the input space, where U is an additional input space introduced by the abstraction $\delta^a$: transition function:

$$\delta^a: Q \times U \rightarrow Z: z^{i+1} = \lambda^a(t^{i+1}, u^{i+1})$$

$\lambda^a$: the output function $$\lambda^a: Q \times U \rightarrow Z: z^{i+1} = \lambda^a(t^{i+1}, u^{i+1})$$

Z: space of internal signals appearing in constraints

Figure 10:
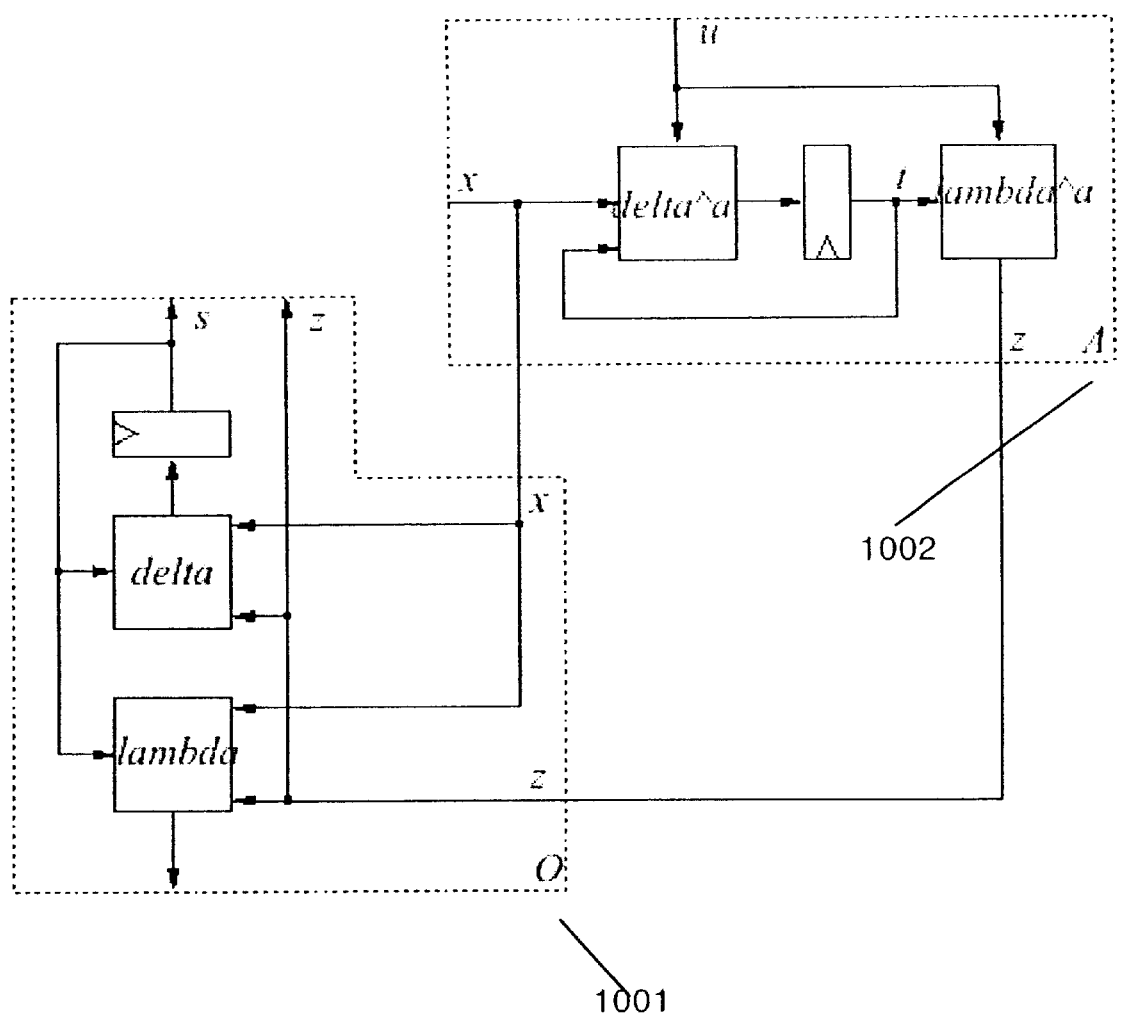
FIG. 10 is a block schematic diagram of a finite state machines O and A under analysis according to the invention.

With respect to FIG. 10, the composition of O 1001 and A 1002 as considered during the analysis is shown. The state elements for s and t are shown explicitly; all other elements are combinational.

The definitions of the sets derived during analysis of the observer change as follows:

$R^a$: the set of states reachable from $q_0^a$ for FSM A 1002, where x and u are treated as free inputs.

$R^z = \{z \in Z | \exists u \in U, \exists t \in R^a: z = \lambda^a(t, z)\}$: the set of values for z when starting from $q_0^a$.

R: the set of states reachable from $q_0$ for FSM O 1001, where the x signals are treated as a free inputs and the z signals are restricted to $R^z$.

u are treated as free inputs.

$D_0$: set of reachable states that have only illegal outgoing transitions:

$$D_0 = \{s \in R | \forall x \in X, \exists z \in R^z: \lambda(s, x, z) = 0\}$$

$D_1$: set of reachable states from which an illegal outgoing transition is unavoidable. $D_1$ is the result of the following fixed point computation:

$$D_1^0 = D_0$$
$$D_1^{i+1} = D_1^i \cup \{s \in R | \forall x \in X, \exists z \in R^z: \lambda(s, x, z) = 0 \vee \delta(s, x, z) \in D_1^i\}$$

$D_2$: set of reachable states that can reach a state in $D_i$ in one step, but are not in $D_1$.

$$D_2 = \{s \in R \setminus D_1 | \exists x \in X, \exists z \in R^z: \delta(s, x, z) \in D_1\}$$

$U_{ill1}$: illegal extended states:

$$U_{ill1} = \{(s, x, z) \in (R \setminus D_1) \times X \times R^z | \lambda(s, x, z) = 0\}$$

$U_{ill2}$: additional illegal extended states:

$$U_{ill2} = \{(s, x, z) \in D_2 \times X \times R^z | \delta(s, x, z) \in D_1\}$$

For a given observer $O(Q, q_0, X, Z, \delta, \lambda)$, a corrector C is constructed that is a composition of $\mathbf{0}$ and a mapper $\mu$.

Y: external input space $\mu$: mapper: $\mu: Q \times Z \times Y \rightarrow X: x^{i+1} = \mu(s^i, z^{i+1}, y^{i+1})$, where
$\mu(s^i, z^{i+1}, y^{i+1}) =$
   $y^{i+1}$ if $(s^i, z^{i+1}, y^{i+1}) \in (R \times X \times Z) \setminus U_{ill}$
   a if $(s^i, z^{i+1}, y^{i+1}) \in U_{ill}$, where
      $a \in \{x \in X | (s^i, z, x) \notin U_{ill}\}$
   don't care otherwise Conservative Analysis A more conservative, but simpler, analysis does not consider the correlation between the internal signals z affecting the constraints. This corresponds to considering the signals z as primary inputs; consequently $R^z = Z$ in the previous analysis.

Discussion

The presence of internal signals of the DUV in the constraints does not require any significant change to the invention's method. The major difference is that, in this case, the analysis makes conservative assumptions. Consequently, for some designs and for some set of constraints, there may exist (infinite-length) legal sequences y that do not violate any constraints, but that are nevertheless altered by the corrector. Furthermore, the composite DUV', may even not be capable of reproducing that sequence y at x. In other words, if constraints involve internal signals of the DUV, the invention's construction makes conservative assumptions that may restrict the set of legal behaviors that can be exercised.

Two types of analyses have been presented: an aggressive and a more conservative one. Both analyses make conservative assumptions, but the assumptions made by the first analysis are weaker. The aggressive analysis does take into account some of the correlation among the internal signals z. To this end it considers an abstract model for that part of the DUV that affects the constraints. The choice of abstract model involves a tradeoff between accuracy and computational cost of the analysis. The more conservative analysis assumes that the internal signals z are free signals: they can assume any value at any instance of time.

In conclusion, the invention is capable of handling constraints involving internal signals of the DUV correctly.

Example

Figure 11:
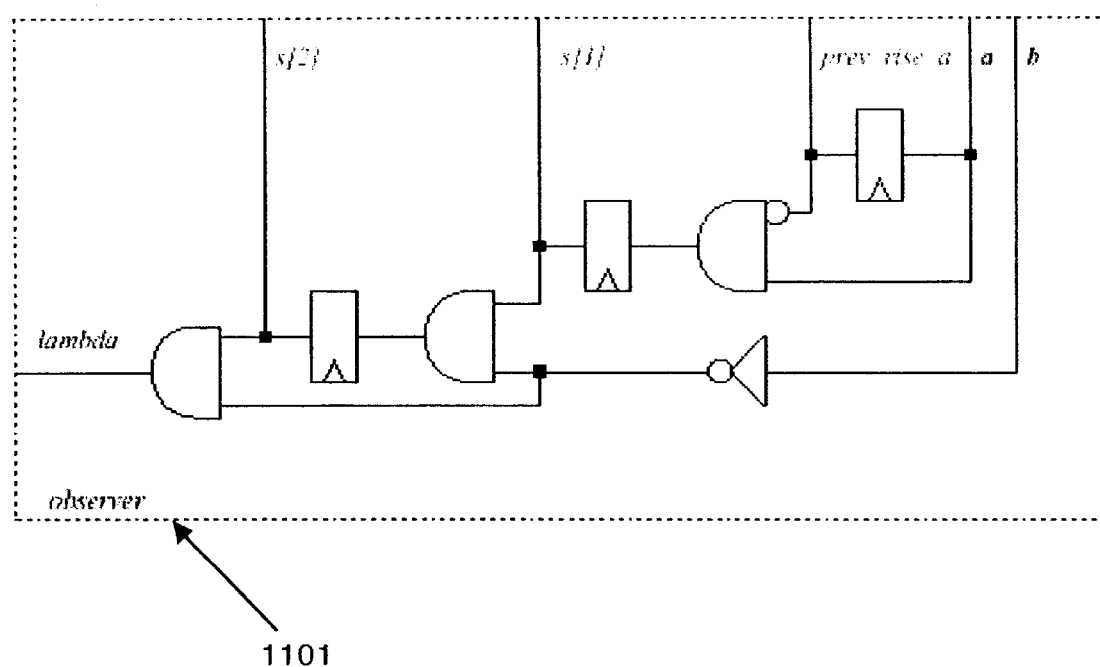
FIG. 11 is a block schematic diagram of an observer logic circuit according to the invention.

Consider the following temporal constraint in the e language and event definitions:

expect (@{rise_a}=>{[. . . 1]; @high_b}) @clk;

event rise_a is rise('top.a') @clk;

event high_b is true('top.b'==1) @clk;

event clk is rise('top.clk') @sim;

This constraints can be expressed by the following finite-state machine (observer) specified in Verilog:

assign rise_a=(top.a==1) & prev_rise_a==0);

assign high_b=(top.b==1);

always @(posedge top.clk)
   prev_rise_a<=top.a;

assign Expect_fail_sfexample_17=(!high_b & s[2]);

always @(posedge top.clk)
   begin
   s[1]<=rise_a;
   s[2]<=(!high_b & s[1]);
   end The signal Expect_fail_sfexample_17 corresponds to the inverse of the λ function. Referring to FIG. 11, the logic circuit 1101 corresponding to the observer is shown.

Analysis of Observers

Figure 12:
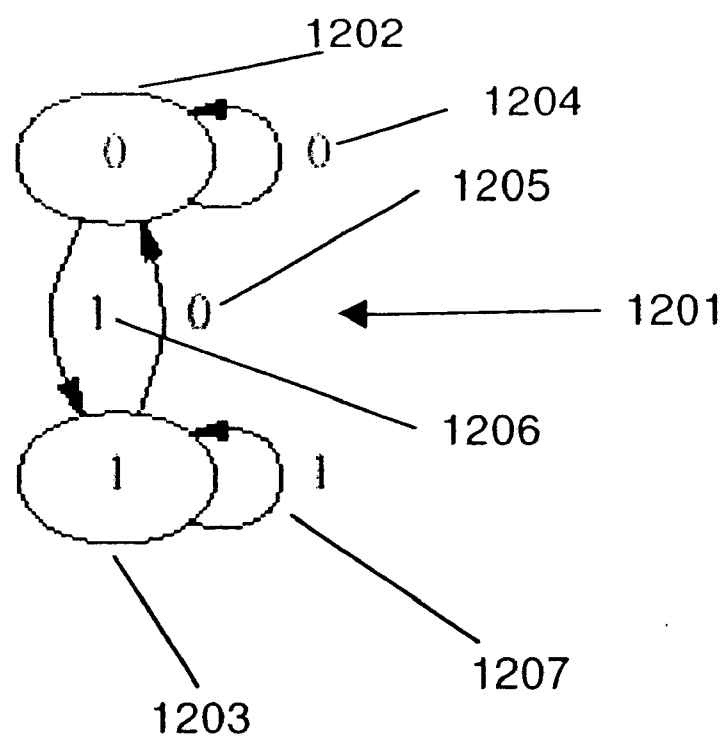
FIG. 12 is a block schematic diagram of a finite state machine (FSM) having a single-bit state according to the invention.

With respect to FIGS. 12, 13, 14, and 15, the observer is composed of two finite state machines (FSMs). The first computes rise_a and has a single bit of state; the second computes the top-level expression. The state transition graph of the first FSM 1201 is shown in FIG. 12. The labels of nodes 1202, 1203 refer to assignments to prev_rise_a; the labels of edges 1204, 1205, 1206, 1207 refer to assignments to top.a.

Figure 13:
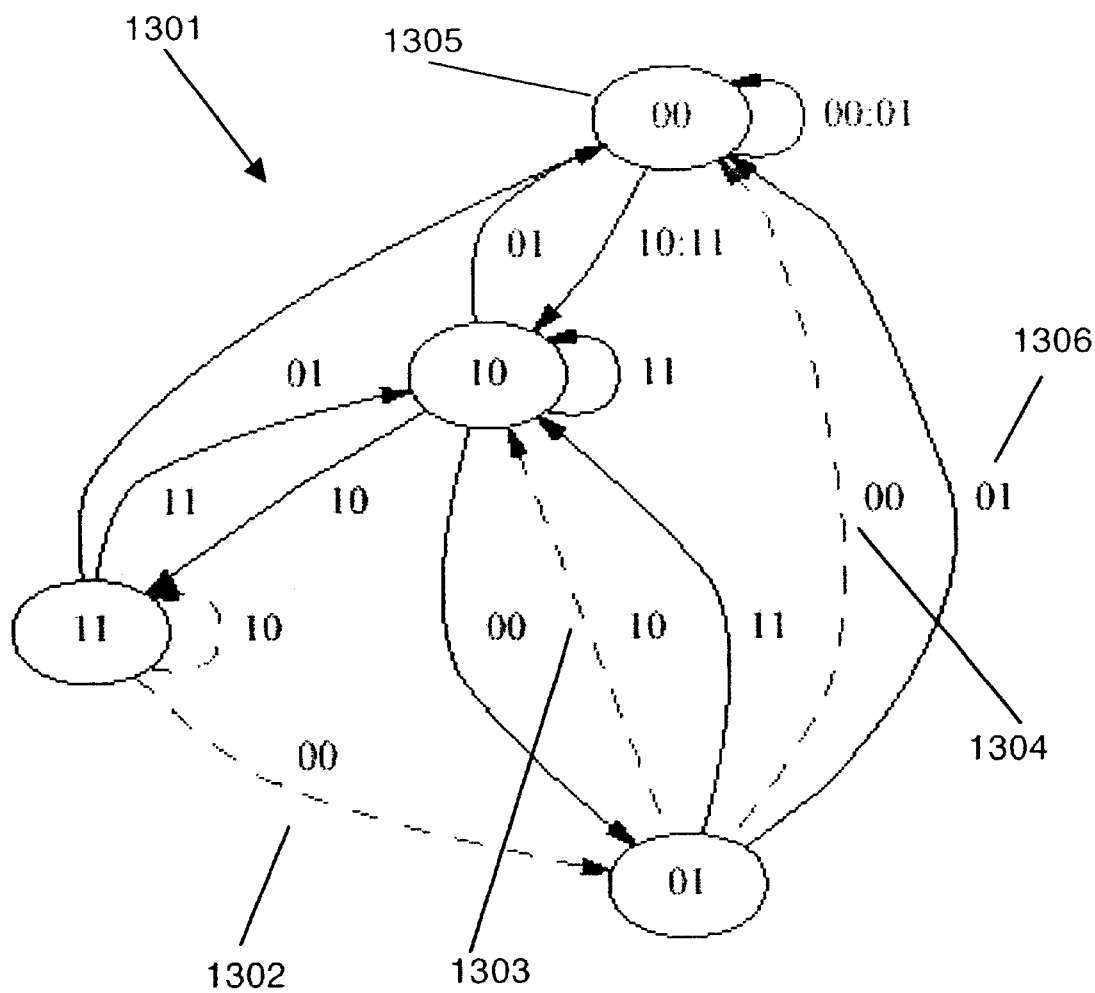
FIG. 13 is a block schematic diagram of a top-level FSM according to the invention.

The state transition graph of the second FSM 1301 is shown in FIG. 13. The labels of the nodes 1305 refer to assignments to s[1] s[2]; the labels of the edges 1306 refer to assignments to top.a top.b. Legal transitions are shown in solid lines, illegal transitions 1302, 1303, 1304 are in dotted lines.

Figure 14:
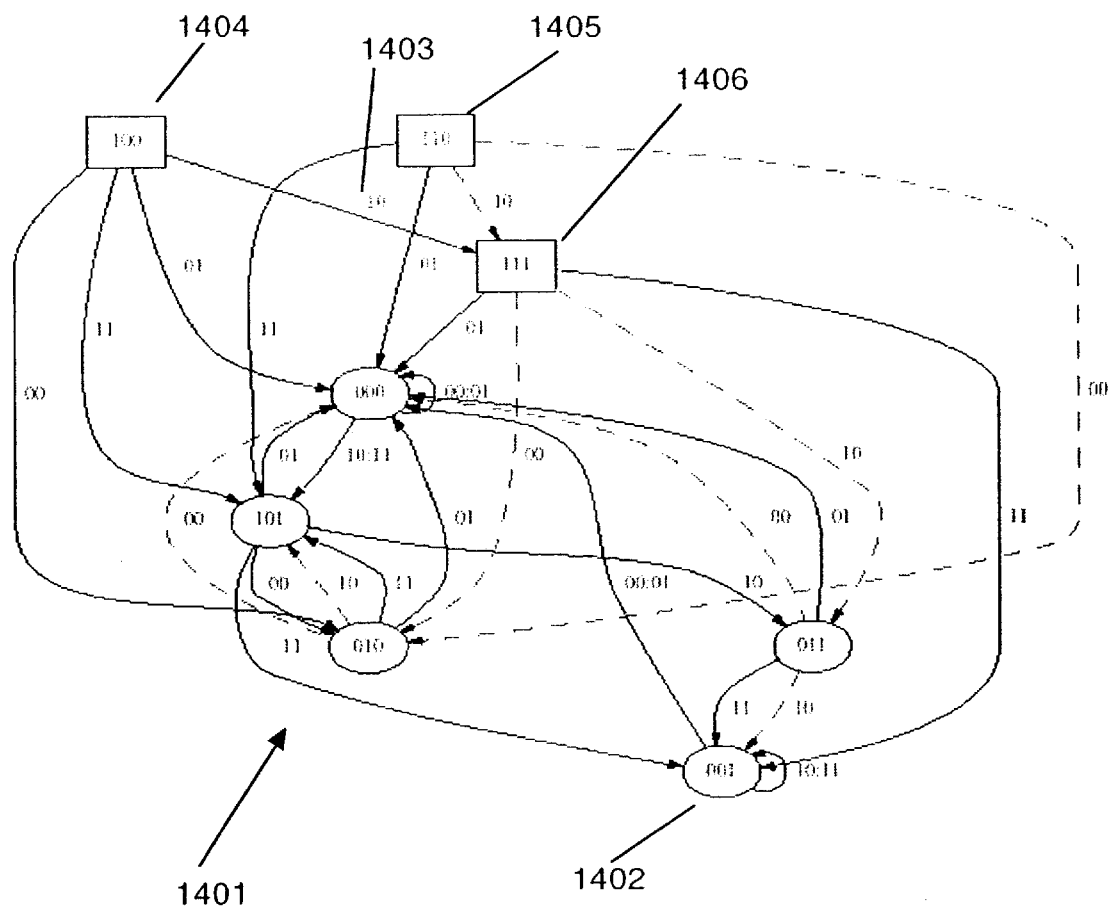
FIG. 14 is a block schematic diagram of a composite FSM according to the invention.

The state transition graph of the composite FSM 1401 is shown in FIG. 14. Nodes 1402 are labeled with s[1] s[2] prev__rise__a. Edges 1403 are labeled with top.a top.b. Note that three states 1404, 1405, 1406, represented by boxes in the diagram, are not reachable. Legal transitions are in solid line, illegal transitions are in dotted line. The truth tables 1501 for the next-state and output functions are shown in FIG. 15. In this table, PS stands for present state, and PI stands for primary input.

In the present construction, the following is computed:

R=S\{100, 110, 111}

$D_0=\emptyset$ $D_1=\emptyset$ $D_2=\emptyset$ $U_{ill1}$={010__00, 010__10, 011__00, 011__10},
where the order of the bits are s[1] s[2] prev__rise__a top.a top.b.

$U_{ill2}=\emptyset$ $U_{ill}=U_{ill1}$

Figure 16:
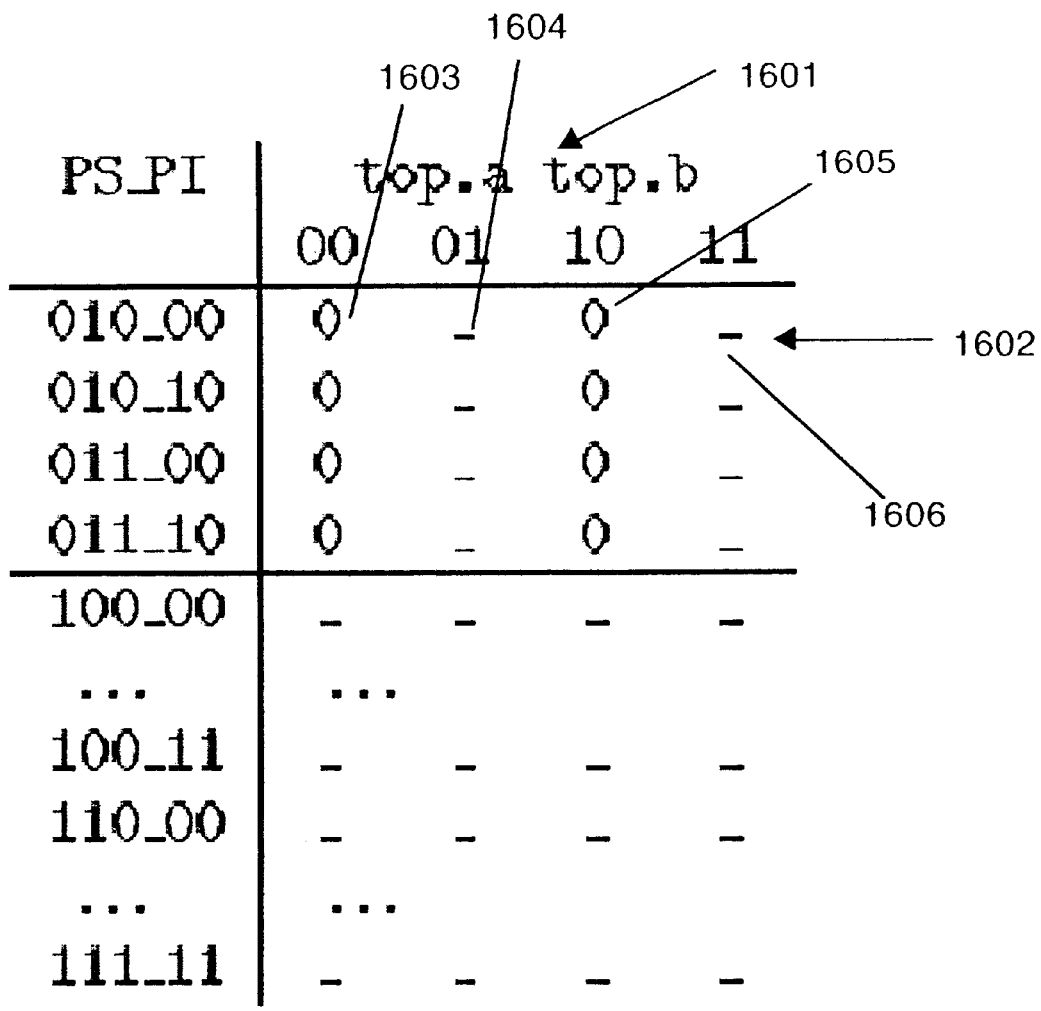
FIG. 16 is a mapper selection matrix according to the invention.

The extended states in $U_{ill}$ are precisely those extended states for which the mapper yields $\mu(s, y) \neq y$. Referring to FIG. 16, the mapper selection matrix 1601 is shown. Extended states that are legal have been omitted in this matrix; for these entries there is no freedom: $\mu(s, y)=y$. The remaining extended states either require $\mu(s, y) \neq y$ or they are part of the don't care set of $\mu$ (in this example all don't cares are due to unreachable states). The matrix 1601 contains one row for each remaining extended state. For example, consider the row corresponding to extended state 010__00 1602. Entry 0, in the second column 1603 (corresponding to top.a top.b=00) indicates that $\mu(010\_00)=00$ is not legal. Similarly, $\mu(010\_00)=10$ is also illegal 1605. The entry in the third column 1604 is still empty, which indicates that $\mu(010\_00)=01$ is a valid choice. Similarly, $\mu(010\_00)=1$ 1606 is also possible.

Synthesis of Mapper

From the table 1601 it can be see that for the first component of $\mu$, $x_1=\mu_1$, we can synthesize an identity mapping, i.e., $$x_1=\mu_1(s, y)=y_1$$

With respect to FIG. 17, the updated mapper selection matrix 1701 is shown.

Comparing Table 1701 to Table 1601, note that the choice of $\mu_1$ results in additional '0' entries in the matrix. For the remaining components, no identity mapping nor a state-independent mapping exists. Using the equations from the Single component: general case section, we derive that:

$$\mu_2^U(s, y)=s_2+y_2+s_1s_3$$

$$\mu_2^L(s, y)=\bar{s}_1s_2\bar{y}_2+\bar{s}_2s_3\bar{y}_2+\bar{s}_1\bar{s}_2y_2$$

$$\mu_2^L \leq \mu_2 \leq \mu_2^U$$

Figure 18:
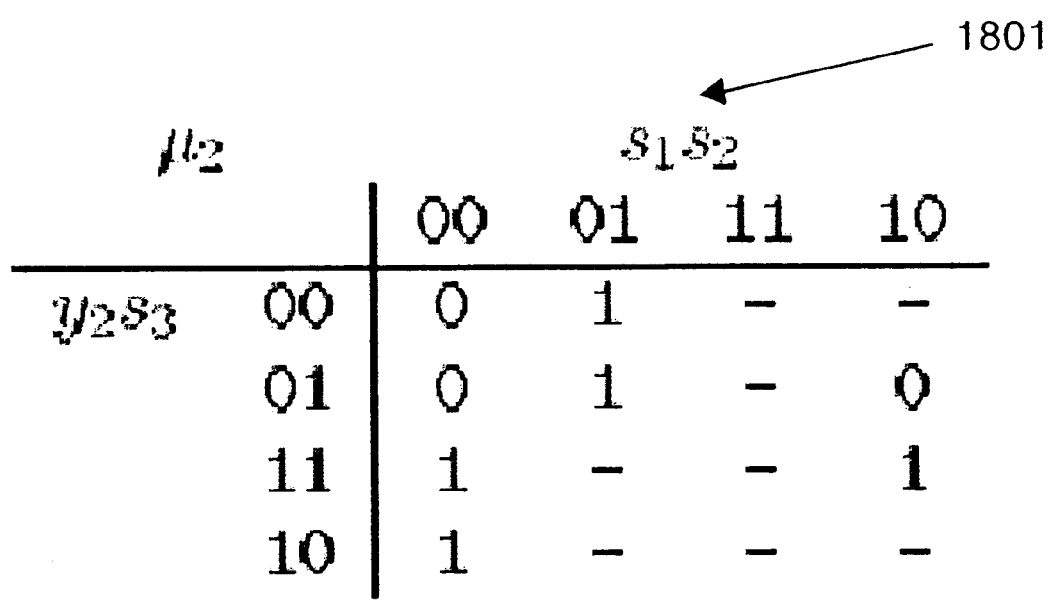
FIG. 18 is a Karnaugh map according to the invention.

Referring to FIG. 18, the Karnaugh map 1801 corresponding to the last equation is shown. A valid choice for $\mu_2$ is:

$$x_2=\mu_2(s, y)=s_2+y_2$$

Figure 20:
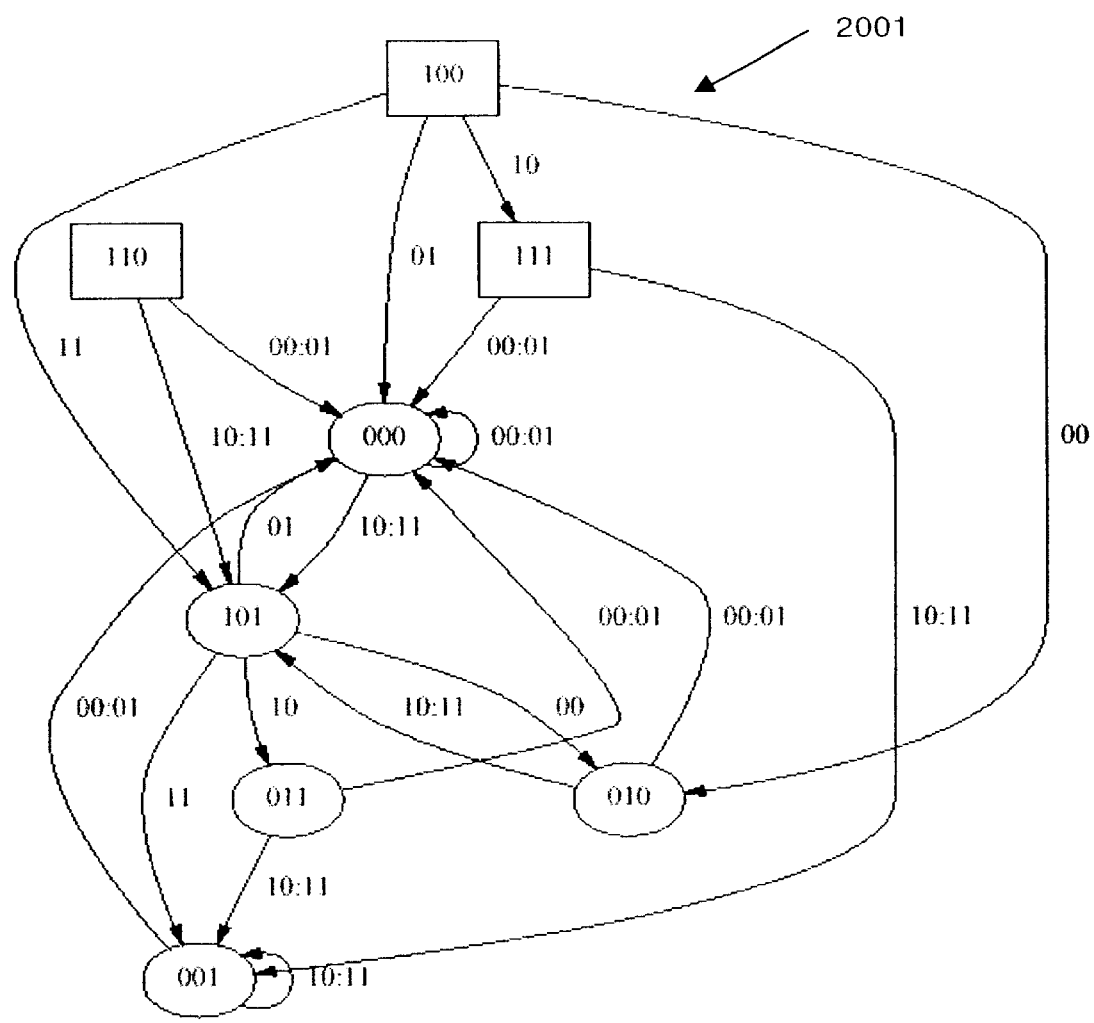
FIG. 20 is a state transition diagram for a corrector according to the invention.
Figure 21:
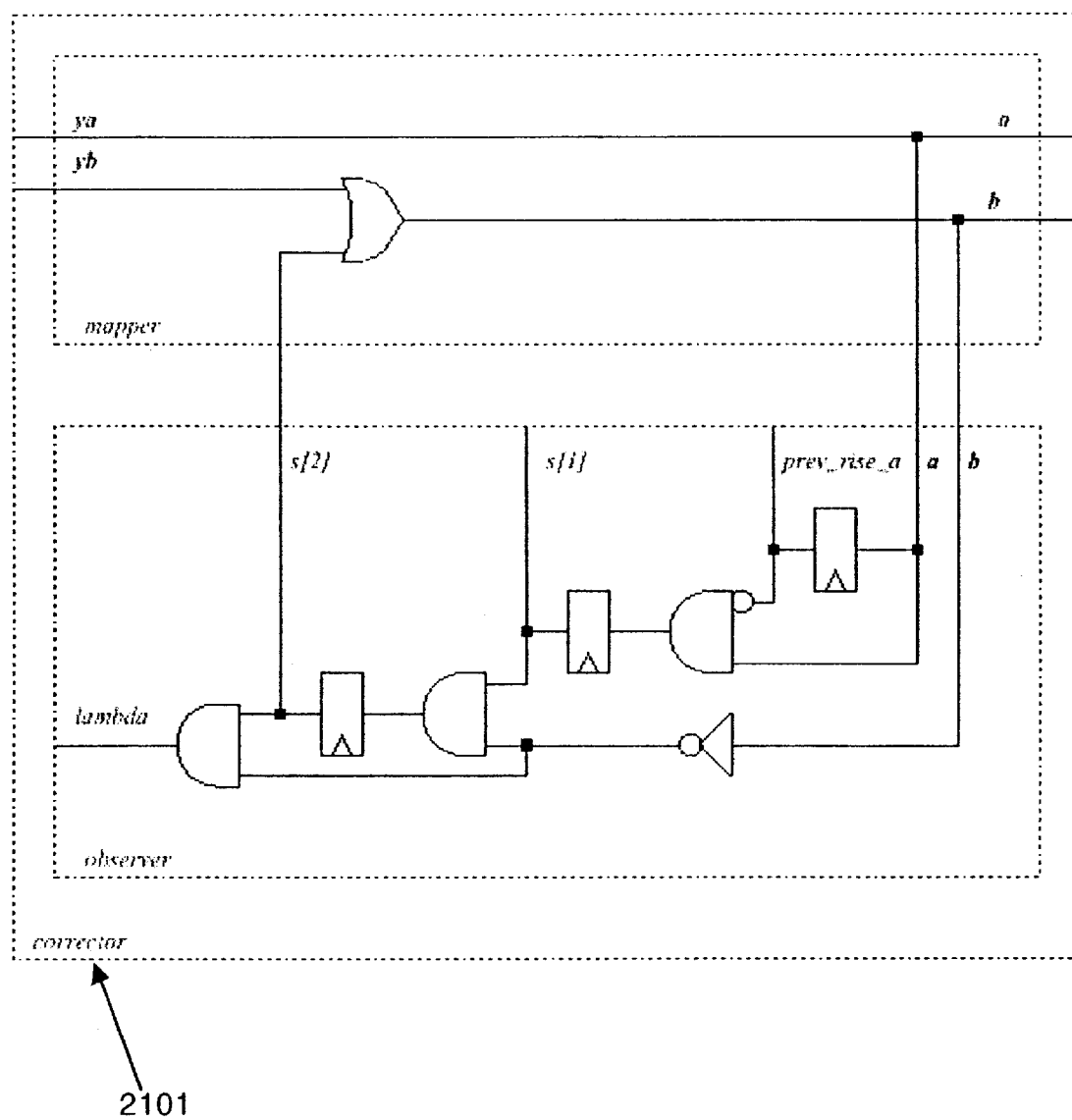
FIG. 21 is a block schematic diagram of a logic circuit for a complete corrector according to the invention.

With respect to FIGS. 19, 20, and 21, the final mapper selection matrix 1901 is shown. Let $C_1$ be the corrector using this $\mu$. Consider again the row corresponding to extended state 010__00 1902. Entry '1' in the second column 1903 indicates that $\mu(010\_00)=01$. The state transition diagram 2001 for $C_1$ is shown in FIG. 20. The logic circuit of the complete corrector 2101 is shown in FIG. 21.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A method for verifying a design under verification (DUV), comprising the steps of:
providing a set of one or more constraints;
wherein each of said constraints describes a limitation on the permissible inputs to said DUV;
providing a set of external test sequences;
wherein said set of external test sequences comprises a compliant test sequence that satisfies said constraints and a non-compliant test sequence that does not satisfy staid constraints;
creating a set of DUV test sequences based on said external test sequences; and
wherein said non-compliant test sequence is changed to satisfy said constraints and said compliant test sequence remains unchanged.

2. The method of claim 1, wherein a first constraint is dependent upon at least one input to said DUV.

3. The method of claim 1, wherein a second constraint is dependent upon at least one state of said DUV.

4. The method of claim 1, wherein a constraint is expressed as a finite-state machine.

5. The method of claim 1, wherein a DUV test sequence is computed one vector at a time and on the basis of prior vectors in said external test sequences.

6. The method of claim 1, wherein a DUV test sequence is computed one vector at a time and on the basis of the current and prior vectors in said external test sequences and current and prior states of said DUV.

7. The method of claim 1, wherein said creation step is an electronic circuit.

8. The method of claim 1, wherein said creation step is a software program.

9. The method of claim 1, wherein said external test sequences are provided by a test generator.

10. An apparatus for verifying a design under verification (DUV), comprising:
a set of constraints;
a source of external test sequences;
wherein said external test sequences comprises a compliant test sequence that satisfies said constraints and a non-compliant test sequence that does not satisfy said constraints; and
a corrector, comprising:
receiving means for receiving external test sequences from said source;
test correcting means for correcting said external test sequences to satisfy said constraints; and
output means for applying modified test sequences to said DUV.

11. The apparatus of claim 10, further comprising:
a connection between said DUV and said corrector that provides said corrector with information about the current state of said DUV as second constraints; and wherein said test correcting means corrects said external test sequences to satisfy said second constraints.

12. The apparatus of claim 10, wherein said corrector further comprises an observer and a mapper; wherein said observer is a finite-state machine representing said constraints; wherein said mapper is a combinational circuit; and wherein said mapper accepts said external test sequences and the current state of said observer as inputs.

13. The apparatus of claim 12, wherein said mapper accepts the current state of said DUV as an input.

14. A method for verifying a design under verification (DUV), comprising the steps of:

providing a set of constraints;

providing a source of external test sequences;

wherein said external test sequences comprises a compliant test sequence that satisfies said constraints and a non-compliant test sequence that does not satisfy said constraints; and providing a corrector, comprising the steps of:

providing receiving means for receiving external test sequences from said source;

providing test-correcting means for correcting said external test sequences to satisfy said constraints; and providing output means for applying modified test sequences to said DUV.

15. The method of claim 14, further comprising:

composing a state transition description representing said constraints;

identifying states from which the violation of at least one constraint is unavoidable; and wherein said test correcting means modifies at least one input vector that would lead to said states.

16. The method of claim 15, wherein said state transition description includes an abstraction of said DUV.

* * * * *

UNITED STATES PATENT AND TRADEMARK OFFICE
CERTIFICATE OF CORRECTION

PATENT NO.    : 6,502,232 B1                                           Page 1 of 1
DATED         : December 31, 2002
INVENTOR(S)   : Van Campenhout It is certified that error appears in the above-identified patent and that said Letters Patent is hereby corrected as shown below:

<u>Title page,</u>
Item [12], replace "Campenhout" with -- Van Campenhout --.

Signed and Sealed this

Twenty-ninth Day of April, 2003

JAMES E. ROGAN
*Director of the United States Patent and Trademark Office*